(12) United States Patent
Penberth

(10) Patent No.: US 8,860,388 B2
(45) Date of Patent: Oct. 14, 2014

(54) DRIVER CIRCUIT AND METHOD OF DRIVING A CAPACITIVE LOAD

(75) Inventor: Michael Penberth, Soham (GB)

(73) Assignee: Global Inkjet Systems Limited (GB)

( * ) Notice: Subject to any disclaimer, the term of this patent is extended or adjusted under 35 U.S.C. 154(b) by 169 days.

(21) Appl. No.: 13/700,144

(22) PCT Filed: May 31, 2011

(86) PCT No.: PCT/GB2011/051025
§ 371 (c)(1),
(2), (4) Date: Dec. 18, 2012

(87) PCT Pub. No.: WO2011/151642
PCT Pub. Date: Dec. 8, 2011

(65) Prior Publication Data
US 2013/0194833 A1 Aug. 1, 2013

(30) Foreign Application Priority Data
Jun. 1, 2010 (GB) .................................. 1009150.2

(51) Int. Cl.
| | | |
|---|---|---|
| G05F 1/00 | (2006.01) |
| G05F 1/24 | (2006.01) |
| H01L 41/04 | (2006.01) |
| B41J 2/045 | (2006.01) |
| H02M 3/156 | (2006.01) |
| H02M 1/34 | (2007.01) |

(52) U.S. Cl.
CPC ........... *B41J 2/04541* (2013.01); *H01L 41/042* (2013.01); *B41J 2/04581* (2013.01); *B41J 2/0452* (2013.01); *H02M 3/156* (2013.01); *H02M 2001/342* (2013.01); *Y02B 70/1491* (2013.01)
USPC .......................................... 323/271; 323/259

(58) Field of Classification Search
USPC .................. 323/247, 259, 268–275, 282–285
See application file for complete search history.

(56) References Cited

U.S. PATENT DOCUMENTS 4,054,936 A * 10/1977 Ansai et al. .................... 361/257
4,710,859 A * 12/1987 Rilly .......................... 363/21.12

(Continued)

FOREIGN PATENT DOCUMENTS

| DE | 19714609 | 10/1998 |
|---|---|---|
| EP | 2254170 | 11/2010 |
| FR | 2829314 | 3/2003 |

*Primary Examiner* — Timothy J Dole
*Assistant Examiner* — Yusef Ahmed
(74) *Attorney, Agent, or Firm* — Hartman Global IP Law; Gary M. Hartman; Michael D. Winter

(57) ABSTRACT

A driver circuit (1) for driving a capacitive load (2) with a drive pulse having a rise time, a predetermined voltage period and a fall time. The driver circuit (1) includes an inductance (6), switches (10, 11, 12), and a transformer (8) having a primary side (8) and secondary side (9). The switches (10, 11, 12) are controlled by a controller (13) to charge the inductance (6) from a power supply (4), and, when the capacitive load (2) is to be driven, to enable a charge path from the inductance (6) to the capacitive load (2) during the rise time, to disable the charge path during the constant peak voltage period and to enable a discharge path via the primary side (8) of the transformer (7) during the fall time. As the capacitive load (2) discharges through the primary side (8) of the transformer (7), charge is induced on the secondary side (9) of the transformer (7) and is used to charge the inductance (6), thereby saving power and enabling a lower voltage power supply to be used.

11 Claims, 1 Drawing Sheet

(56) References Cited

U.S. PATENT DOCUMENTS

| | | | |
|---|---|---|---|
| 4,794,508 A * | 12/1988 | Carroll | 363/95 |
| 4,833,339 A * | 5/1989 | Luchaco et al. | 307/115 |
| 5,036,263 A * | 7/1991 | Yamada et al. | 318/116 |
| 5,329,200 A * | 7/1994 | Zaitsu | 310/316.01 |
| 5,543,679 A * | 8/1996 | Morino et al. | 310/316.03 |
| 5,638,260 A * | 6/1997 | Bees | 363/17 |
| 5,739,622 A * | 4/1998 | Zaitsu | 310/316.01 |
| 5,847,941 A * | 12/1998 | Taguchi et al. | 363/21.03 |
| 5,923,546 A * | 7/1999 | Shimada et al. | 363/40 |
| 5,986,899 A * | 11/1999 | Xia et al. | 363/21.06 |
| 6,013,969 A * | 1/2000 | Noma et al. | 310/318 |
| 6,133,672 A * | 10/2000 | Sasaki et al. | 310/318 |
| 6,398,331 B1 * | 6/2002 | Asaka et al. | 347/9 |
| 6,400,583 B1 * | 6/2002 | Lau | 363/21.13 |
| 2002/0136418 A1 * | 9/2002 | Zavis et al. | 381/114 |
| 2004/0145273 A1 | 7/2004 | Khoury et al. | |
| 2004/0223345 A1 * | 11/2004 | Lindmark | 363/22 |
| 2006/0071639 A1 * | 4/2006 | Ross et al. | 320/116 |
| 2008/0094862 A1 * | 4/2008 | Li et al. | 363/21.12 |
| 2009/0090333 A1 | 4/2009 | Spadafora et al. | |
| 2011/0157923 A1 * | 6/2011 | Ren et al. | 363/21.12 |

\* cited by examiner

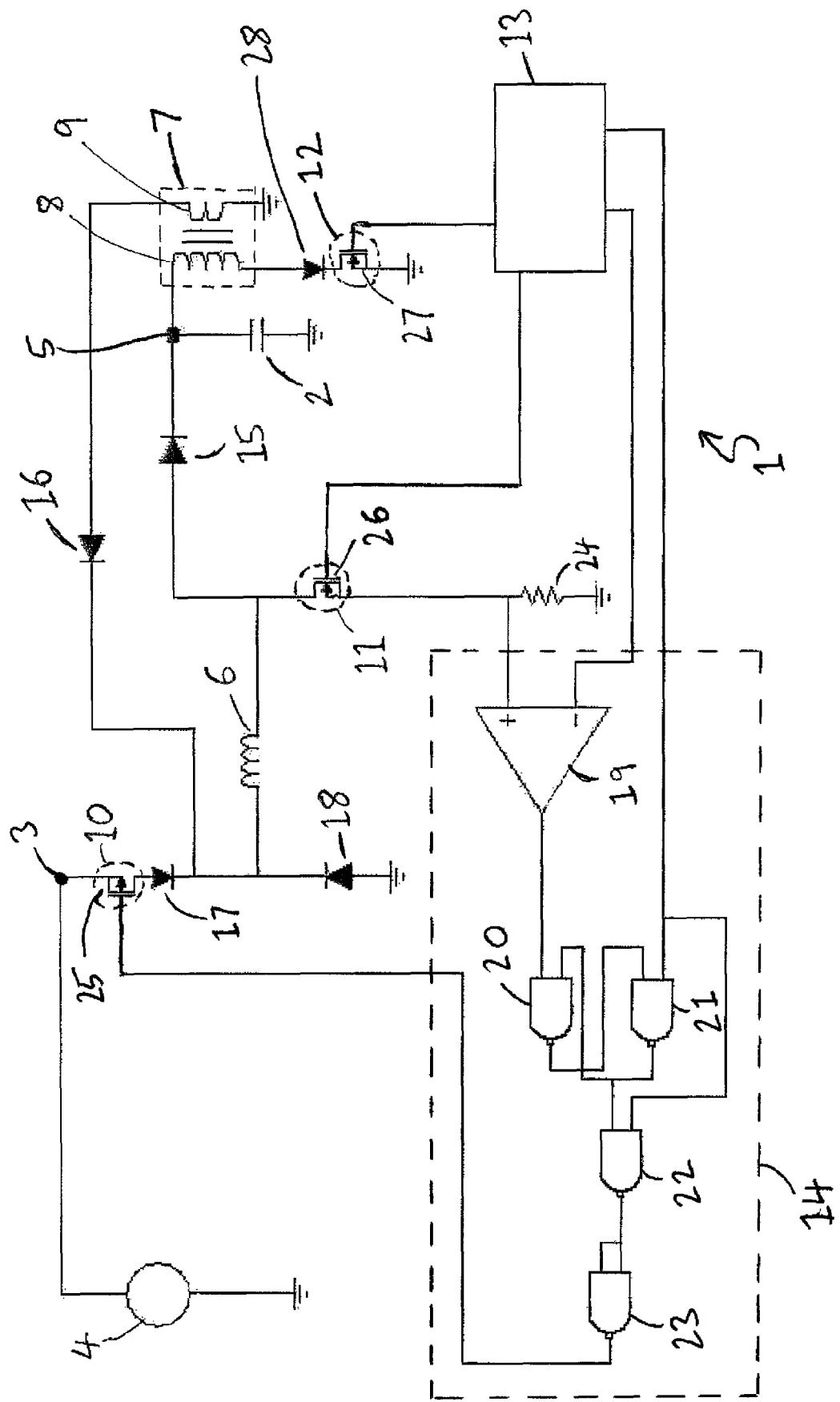

DRIVER CIRCUIT AND METHOD OF DRIVING A CAPACITIVE LOAD

CROSS REFERENCE TO RELATED APPLICATIONS

This application claims the benefit of International Application No. PCT/GB2011/051025 filed May 31, 2011, having a claim of priority to GB Patent Application No. 1009150.2, filed Jun. 1, 2010.

FIELD OF THE INVENTION

This invention relates to a driver circuit, particularly, though not exclusively, a driver circuit for capacitive loads, such as print heads in, for example, ink-jet printers.

BACKGROUND OF THE INVENTION

It is generally well known that inkjet printers are used for printing characters and/or images onto various substrates. Inkjet printers have print heads made up of individually addressable piezoelectric chambers, formed within a piezoelectric material. When actuated and de-actuated, the piezoelectric chambers eject ink droplets and suck in more ink into the chambers. These ink droplets may be placed on the surface of a substrate in a controlled manner, thereby forming individual characters and/or images on the surface of the substrate.

The piezoelectric chambers are controlled using a driver circuit, which is used to apply a predetermined voltage waveform to each of the chambers. The piezoelectric material acts a capacitive load and the capacitance is proportional to the number of piezoelectric chambers actuating at any one time. Therefore, the current required to actuate the chambers increases proportionally with the number of actuating chambers.

For accurate printing, it will be apparent that the drive voltage waveform should have very highly controlled rise and fall slew rates, being of the order of a few μsecs. The current waveform generally consists of a trapezoidal positive pulse during the rise time and a similar negative pulse during the fall time, with no current being drawn during the "on" time.

In most cases, the predetermined voltage level of the waveform, which may be a substantially constant voltage, is of the order of 20-30 V, but in some systems, may need to be a relatively high voltage, for example up to 150 V. In these cases, large power supplies may be needed to power commercial print heads. Of course, high power requirements and large power supplies mean that complex control circuitry and bulky heat dissipaters are required to ensure that heat is removed from the print head without causing damage to the surrounding printing system. This means that the current, of about 1.5 A, is only required for very short periods, even though the high voltage is required for the full "on" time.

BRIEF SUMMARY OF THE INVENTION

The present invention therefore seeks to provide a driver circuit, which overcomes, or at least reduces the above-mentioned problems of the prior art.

Accordingly, in a first aspect, the invention provides a driver circuit for driving a capacitive load with a drive pulse having a rise time, a predetermined voltage period and a fall time, the circuit comprising:

an input for coupling to a power supply;

an inductance having a first electrode coupled to the input via a first charge path including a first switching device, and a second electrode coupled to a first discharge path including a second switching device and to an output of the circuit for selectively charging a capacitive load via a second charge path;

a transformer having a primary side coupled between a second discharge path including a third switching device and the output of the circuit for selectively discharging the capacitive load, the transformer further having a secondary side coupled to the first electrode of the inductance; and a controller coupled to the first, second and third switching devices for:

enabling the first charge path and the first discharge path so that the inductance is charged from the power supply;

disabling the first charge path and the first and second discharge paths so that current flows from the inductance to the output for charging the capacitive load via the second charge path during the drive pulse rise time;

enabling the first discharge path at the end of the drive pulse rise time, whereby current flows from the inductance through the first discharge path via the second switching device during the predetermined voltage period of the drive pulse; and enabling the second discharge path during the fall time of the drive pulse so that the capacitive load discharges via the output and the primary side of the transformer, whereby voltage is induced on the secondary side of the transformer and is used to recharge the inductance.

According to a second aspect, the invention provides a method of driving a capacitive load with a drive pulse having a rise time, a predetermined voltage period and a fall time, the method comprising:

enabling a first charge path between a power supply and an inductance and a first discharge path from the inductance so that the inductance is charged from the power supply;

disabling the first charge path and the first discharge path so that current flows from the inductance to the capacitive load via a second charge path during the drive pulse rise time;

enabling the first discharge path at the end of the drive pulse rise time, whereby current flows from the inductance through the first discharge path during the predetermined voltage period of the drive pulse; and enabling a second discharge path during the fall time of the drive pulse so that the capacitive load discharges via a primary side of a transformer, whereby voltage is induced on a secondary side of the transformer and is used to recharge the inductance.

BRIEF DESCRIPTION OF THE DRAWINGS

One embodiment of the invention will now be more fully described, by way of example, with reference to the drawing which shows a schematic diagram of a driver circuit according to one embodiment of the present invention.

DETAILED DESCRIPTION OF THE DRAWING

Thus, the drawing illustrates a schematic diagram of a driver circuit 1 that is capable of driving a capacitive load 2 with a predetermined substantially trapezoidal waveform whilst requiring only minimal current usage to drive the capacitive load. Driver circuit 1 includes an input 3 coupled to a power supply 4, an output 5, coupled to the capacitive load 2, an inductance 6 coupled between the input 3 and the output 5, and a transformer 7 coupled between the output 5 and the input 3 in parallel with the inductance 6.

The driver circuit 1 further includes a first switching element 10, coupled between the input 3 and a first electrode of the inductance 6 to selectively enable and disable a first charge path between the input 3 (and hence the power supply 4) and the inductance 6, a second switching element 11 coupled between the inductance 6 and ground, via a resistor 24, to selectively enable and disable a first discharge path, a third switching element 12 coupled between a primary side 8 of the transformer 7 and ground to selectively enable and disable a second discharge path for discharging the capacitive load 2, and a controller 13 for controlling the switching elements 10, 11, 12. The switching elements 10, 11, 12 are preferably implemented as circuit elements including a transistor, which may be a MOSFET, as shown 25, 26, 27, and may include other components, as required, as will be appreciated by person skilled in the art. The capacitive load 2 may be an inkjet print head having a plurality of piezoelectric chambers, or other such capacitive load(s).

The first charge path includes a first diode 17, whose anode is connected to the switching element 10 and whose cathode is connected to the first electrode of the inductance 6. A recirculating diode 18 is coupled between the first electrode of the inductance 6 and ground with its cathode connected to the cathode of diode 17 and to the first electrode of inductance 6 and its anode connected to ground. The second charge path includes diode 15, having its anode connected to the second electrode of the inductance 6 and its cathode connected to output 5. The second discharge path includes diode 28 having its anode connected to the primary side 8 of the transformer 7 and its cathode connected to the third switching element 12. A diode 16 is provide between a secondary side 9 of the transformer 7 and the first electrode of the inductance 6, with its anode connected to the secondary side 9 of the transformer 7 and its cathode connected to the first electrode of the inductance 6.

Thus, when the first and second switching elements 10, 11 are closed to enable the first charge path between the input and the first electrode of the inductance 6 and the first discharge path between the second electrode of the inductance and ground, the inductance 6 is charged from the power supply 4, via input 3. The third switching element 12 should be open at this time. Once the inductance 6 is charged it can be used to charge the capacitive load 2. This occurs by opening first and second switching elements 10 and 11, while maintaining third switching element 12 open. Thus, the inductor current will flow through the diode 15 via output 5 to charge the capacitive load 2. To stop charging the capacitive load 2, the second switching element 11 is closed. To discharge the capacitive load 2, the third switching element 12 is closed allowing the capacitive load to discharge through the second discharge path including the primary side 8 of transformer 7 and diode 28 to ground. As the capacitive load 2 discharges though the primary side 8 of transformer 7, power is induced on the secondary side 9 of transformer 7, and this current passes through diode 16 back to the first electrode of inductance 6 to recharge the inductance 6.

In order to control the inductor charging from the power supply 4, a current comparator circuit 14 is used to compare the current in the first discharge path and a predetermined set value provided by the controller 13. The current comparator circuit includes a differential comparator 19 having a positive input connected to the first discharge path between the second switching element 11 and the resistor 24. The differential comparator has a negative input connected to the controller 13 for receiving the predetermined set value of the required current from the controller 13. An output of the differential comparator 19 is applied to a logic gate circuit made up of several logic gates, as shown. It will, of course, be apparent that other configurations are possible. The logic gate circuit includes first and second NAND gates 20, 21 connected to function as a NAND gate flip-flop, with the output from the differential comparator 19 forming one input to the flip-flop and a refresh signal from the controller 13 forming a second input to the flip-flop. The output of the flip-flop is passed as one input to a third NAND gate 22, whose other input is provided by the refresh signal from the controller 13, and the output of the third NAND gate is coupled to both inputs of a fourth NAND gate 23, whose output is used to control the first switching element 10. Thus, when controlled by the controller, the current comparator circuit 14 compares the current in the first discharge path with a predetermined value and controls the first switching element to disable the first charge path when the current exceeds the predetermined value.

Thus, when the switching elements 10 and 11 are closed, the inductance 6 will charge until a current level, determined by the current comparator circuit 14, has been reached. When the current level in the inductance 6 has reached the predetermined level the switch 10 is opened, thereby preventing further charging of the inductance 6. The inductance 6 will, however, try to maintain current flow, and current will continue to flow through the cathode of the diode 18 and through the first discharge path with a decay rate dependant on the forward drop of the diode 18 plus the resistive drop of the resistor 24. Thus, if the current level falls below the required level, switching element 10 will be closed and the inductance 6 will be charged up as before. The current comparator circuit 14 is provided with a level of hysteresis so recharging will only restart when the charge in the inductance 6 has decayed by the hysteresis level.

When the inductance 6 is charged to the predetermined level it is possible to present the required drive pulse to the capacitive load 2. As mentioned above, at this time, the switching elements 10 and 12 are open and switching element 11 is closed to maintain, and monitor, the charge levels in the inductance 6. When the switching element 11 is opened, the inductance current will flow through the diode 15 into the capacitive load 2, thereby charging the capacitive load 2. The rise slew rate of the voltage waveform is determined by the level of the inductance charge, whilst the peak voltage is determined by the time for which the switching element 11 is open.

Once charged, the capacitive load 2 will remain charged until switching element 12 is closed, thereby providing a discharge path for the capacitive load 3 through the primary side 8 of transformer 7. During discharge, energy is induced on the secondary side 9 of transformer 7, whereby it is returned to the first electrode of the inductance 6 through the diode 16. The fall slew rate is determined by the current flowing in inductance 6 coupled through the transformer 7 to discharge the capacitive load 2.

The controller 13 is, of course, communicable with various other external circuits (not shown), such as computers, networks and/or modems, so as to control the switching elements 10, 11, 12 in response to user inputs, which may be in the form of software stored on the controller 13 or on an external computer. In normal operation a user device will request that the capacitive load 2 is charged, whereby a trigger pulse is sent to the controller 13 from the user device. It is necessary to interrupt the recharge pulses when a trigger pulse is received and this generally occurs on an asynchronous basis. The maximum width of the charge pulse determines by how much the charge can decay and still recover to the set level during the charge and, therefore, how frequent the recharge pulses must be. Therefore, it may be necessary to initiate a charge pulse before trigger pulse to ensure that the required level of charge is stored in the inductance 6.

Thus, the advantages of the present invention are that an inductance is used for charging the capacitive load, whereby energy used for charging the capacitive load is recycled in the system, by returning the energy from the discharging capacitive load to the inductance. Therefore, a reduced voltage is required to charge the inductance to a sufficient level to obtain drive pulses with waveforms having such attributes as a rise time, a predetermined voltage period and a fall time. The predetermined voltage may be a substantially constant peak voltage, or may have a predetermined shape. The reduction in power required for a device using the present invention, in comparison to a device not using the present invention, allows for low voltage power supplies, smaller heat dissipaters and less complex heat control circuitry to be used, resulting in increased cost and space savings. Furthermore, the slew rates and predetermined voltages of the waveforms may be dynamically modified as required to generate waveforms for a multitude of applications.

It will be appreciated that although only one particular embodiment of the invention has been described in detail, various modifications and improvements can be made by a person skilled in the art without departing from the scope of the present invention. For example, although a MOSFET has been used to embody a "switch", it will be appreciated that this is not intended to mean that other devices could not be used instead. Furthermore, the circuit has been described in schematic form to enable it to be easily understood by a person skilled in the art. Nevertheless, it will be appreciated that other components and devices may well be utilised in the circuit, if desired.

The invention claimed is:

1. A driver circuit for driving a capacitive load with a drive pulse having a rise time, a predetermined voltage period and a fall time, the circuit comprising:
    an input for coupling to a power supply;
    an inductance having a first electrode coupled to the input via a first charge path including a first switching device, and a second electrode coupled to a first discharge path including a second switching device and to an output of the circuit for selectively charging a capacitive load via a second charge path;
    a transformer having a primary side coupled between a second discharge path including a third switching device and the output of the circuit for selectively discharging the capacitive load, the transformer further having a secondary side coupled to the first electrode of the inductance;
    and
    a controller coupled to the first, second and third switching devices for:
        enabling the first charge path and the first discharge path so that the inductance is charged from the power supply;
        disabling the first charge path and the first and second discharge paths so that current flows from the inductance to the output for charging the capacitive load via the second charge path during the drive pulse rise time;
        enabling the first discharge path at the end of the drive pulse rise time, whereby current flows from the inductance through the first discharge path via the second switching device during the predetermined voltage period of the drive pulse; and
        enabling the second discharge path during the fall time of the drive pulse so that the capacitive load discharges via the output and the primary side of the transformer, whereby voltage is induced on the secondary side of the transformer and is used to recharge the inductance.

2. The driver circuit according to claim 1, wherein the controller selectively enables or disables each of the charge and discharge paths.

3. The driver circuit according to claim 1, further comprising a current comparator circuit having a first input coupled to the first discharge path and a second input coupled to the controller for receiving a predetermined set current value from the controller, whereby the current comparator circuit compares the current on the first discharge path and the predetermined set current value and controls the first switching element to maintain a predetermined level of charge on the inductance.

4. The driver circuit according to claim 3, wherein the current comparator circuit comprises a differential comparator having a positive input coupled to the first input of the current comparator circuit and a negative input coupled to the second input of the current comparator circuit, wherein an output of the differential comparator is coupled to a latching circuit for controlling the first switching device.

5. The driver circuit according to claim 1, wherein the switching devices are semiconductor devices.

6. The driver circuit according to claim 1, wherein the switching devices are MOSFET transistors.

7. The driver circuit of claim 1, wherein the controller is configured to enable the first charge path and the first discharge path so that the inductance is charged from the power supply by closing the first and second switching devices while the third switching device remains open, disable the first charge path and the first and second discharge paths so that current flows from the inductance to the output for charging the capacitive load via the second charge path during the drive pulse rise time by opening the first and second while the third switching device remains open, enable the first discharge path at the end of the drive pulse rise time by closing the second switching path, and enable the second discharge path during the fall time of the drive pulse by closing the third switching path.

8. A print head driver system comprising a driver circuit according to claim 1.

9. A method of driving a capacitive load with a drive pulse having a rise time, a predetermined voltage period and a fall time, the method comprising:
    enabling a first charge path between a power supply and an inductance and a first discharge path from the inductance so that the inductance is charged from the power supply;
    disabling the first charge path and the first discharge path so that current flows from the inductance to the capacitive load via a second charge path during the drive pulse rise time;
    enabling the first discharge path at the end of the drive pulse rise time, whereby current flows from the inductance through the first discharge path during the predetermined voltage period of the drive pulse; and
    enabling a second discharge path during the fall time of the drive pulse so that the capacitive load discharges via a primary side of a transformer, whereby voltage is induced on a secondary side of the transformer and is used to recharge the inductance.

10. The method according to claim 9, further comprising comparing the current on the first discharge path and a predetermined set current value selectively enabling and disabling the first charge path so as to maintain a predetermined level of charge on the inductance.

11. The method of claim 9, wherein enabling the first charge path and the first discharge path so that the inductance is charged from the power supply is performed by closing the first and second switching devices while the third switching device remains open, disabling the first charge path and the first and second discharge paths so that current flows from the inductance to the output for charging the capacitive load via the second charge path during the drive pulse rise time is performed by opening the first and second while the third switching device remains open, enabling the first discharge path at the end of the drive pulse rise time is performed by closing the second switching path, and enabling the second discharge path during the fall time of the drive pulse is performed by closing the third switching path.

\* \* \* \* \*